(12) United States Patent
Kim et al.

(10) Patent No.: US 12,276,694 B2
(45) Date of Patent: Apr. 15, 2025

(54) COOLANT SUPPLYING APPARATUS, AND TEMPERATURE CONTROLLING APPARATUS AND TEST HANDLER INCLUDING THE SAME

(71) Applicant: SEMES CO., LTD., Cheonan-si (KR)

(72) Inventors: Young Joo Kim, Hwaseong-si (KR); Joo Hyun Seo, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 212 days.

(21) Appl. No.: 17/943,766

(22) Filed: Sep. 13, 2022

(65) Prior Publication Data

US 2023/0083489 A1   Mar. 16, 2023

(30) Foreign Application Priority Data

Sep. 16, 2021 (KR) .................. 10-2021-0123715

(51) Int. Cl.
| | | |
|---|---|---|
| G01R 31/28 | (2006.01) | |
| G01R 1/00 | (2006.01) | |
| G01R 1/02 | (2006.01) | |
| G01R 1/04 | (2006.01) | |
| G01R 1/067 | (2006.01) | |
| G01R 1/073 | (2006.01) | |
| G01R 31/26 | (2020.01) | |
| H05K 7/20 | (2006.01) | |

(52) U.S. Cl.
CPC ...... *G01R 31/2877* (2013.01); *G01R 31/2867* (2013.01)

(58) Field of Classification Search
CPC .. H05K 7/20; H05K 7/20145; H05K 7/20272; H05K 7/20281; G01R 1/00; G01R 1/02; G01R 1/04; G01R 1/067; G01R 1/073; G01R 31/02; G01R 31/26; G01R 31/28; G01R 31/2891; G01R 31/2875; G01R 31/2877; G01R 31/2863; G01R 31/2868; G01R 31/31
See application file for complete search history.

(56) References Cited

U.S. PATENT DOCUMENTS

| | | |
|---|---|---|
| 6,861,861 B2 | 3/2005 | Song et al. |
| 2004/0231794 A1 | 11/2004 | Hongo |
| 2014/0077829 A1* | 3/2014 | Oh ................ G01R 31/2874 324/750.08 |

(Continued)

FOREIGN PATENT DOCUMENTS

| | | |
|---|---|---|
| CN | 111412567 | 7/2020 |
| JP | 2003-197591 | 7/2003 |

(Continued)

OTHER PUBLICATIONS

Office Action of the Korean Intellectual Patent Office dated Dec. 8, 2023.

*Primary Examiner* — Neel D Shah (57) ABSTRACT

A coolant supplying apparatus, which is configured to prevent dew condensation from being generated in a supply of coolant, and a temperature controlling apparatus and a test handler including the same are provided. The coolant supplying apparatus includes a housing having an outlet, a coolant spraying part arranged inside the housing and configured to discharge coolant around the outlet of the housing, and a dry air injection part configured to inject dry air into the housing.

19 Claims, 9 Drawing Sheets

(56) References Cited

U.S. PATENT DOCUMENTS

2021/0003632 A1\* 1/2021 Kim ..................... G11C 29/06

FOREIGN PATENT DOCUMENTS

| KR | 10-2002-0036524 | | 5/2002 | | |
|----|-----------------|---|---------|---|---|
| KR | 10-2004-0009665 | | 1/2004 | | |
| KR | 10-2015-0144423 | | 12/2015 | | |
| KR | 10-2020-0049006 | | 5/2020 | | |
| KR | 10-2295219 | | 8/2021 | | |
| KR | 102622091 | \* | 1/2024 | ....... | H01L 21/67017 |

\* cited by examiner

COOLANT SUPPLYING APPARATUS, AND TEMPERATURE CONTROLLING APPARATUS AND TEST HANDLER INCLUDING THE SAME

CROSS REFERENCE TO RELATED APPLICATION

The present application claims priority to Korean Patent Application No. 10-2021-0123715, filed Sep. 16, 2021, the entire contents of which is incorporated by reference herein for all purposes.

BACKGROUND OF THE INVENTION

Field of the Invention

The present disclosure relates to a coolant supplying apparatus, and a temperature controlling apparatus and a test handler including the same. More particularly, the present disclosure relates to a coolant supplying apparatus capable of coolant without dew condensation, and a temperature controlling apparatus and a test handler including the same.

Description of the Related Art

In general, semiconductor devices may be formed on a silicon wafer used as a semiconductor substrate while a series of manufacturing processes are repeatedly performed. The semiconductor devices formed as described above may be manufactured into semiconductor packages through a dicing process, a bonding process, and a packaging process.

The manufactured semiconductor packages can be graded through electrical performance tests. The test process may be performed using a test handler that handles the semiconductor packages and a tester that provides a test signal to test the semiconductor package.

The test process may be performed after storing the semiconductor package into insert assemblies mounted to a test tray and then electrically connecting external connector terminals of the semiconductor packages stored in the insert assemblies to the tester. An interface board connecting the semiconductor packages to the tester may be mounted to a side wall of the test chamber to perform the test process, and socket boards may be arranged on the interface board to connect the semiconductor packages to the interface board. In addition, the interface board may be connected to the tester providing a test signal to the semiconductor packages.

In performing the test process, for example, the semiconductor packages may be tested in a high temperature environment of 80° C. or more or a low temperature environment of −40° C. or less. In order to create this environment, a chamber in which the semiconductor packages are stored includes a device (e.g., heater and cooling device) to maintain a constant temperature.

Meanwhile, in order to maintain the low environment in the chamber, coolant (e.g., liquefied nitrogen) may be supplied into the chamber. Herein, moisture existing inside the chamber is cooled around a port through which the coolant is supplied, and dew condensation may be generated. Therefore, a method to prevent the dew condensation from being generated around a coolant supply location is required.

SUMMARY OF THE INVENTION

Therefore, an embodiment of the present disclosure provides a coolant supplying apparatus configured to prevent dew condensation from being generated in a supply of coolant and a temperature controlling apparatus and a test handler including the same.

The problem to be solved is not limited thereto, and other problems not mentioned will be clearly understood by those skilled in the art from the subsequent description.

In order to achieve the above objective, according to one aspect of the present disclosure, there is provided a coolant supplying apparatus including: a housing having an outlet; a coolant spraying part arranged inside the housing and configured to discharge coolant around the outlet of the housing; and a dry air injection part configured to inject dry air into the housing.

According to one aspect of the present disclosure, a temperature controlling apparatus may include: an air current generating part configured to generate an air current in a processing space a chamber; a temperature measurement part provided inside the chamber and configured to measure temperature in the chamber; a coolant supply control part configured to control a supply of coolant on the basis of the temperature measured by the temperature measurement part; and a coolant supplying apparatus configured to supply coolant into the chamber, wherein the coolant supplying apparatus may include: a housing having an outlet; a coolant spraying part arranged inside the housing and configured to spray coolant around the outlet of the housing; and a dry air injection part configured to inject dry air into the housing.

According to one aspect of the present disclosure, a test handler may include: a loading unit on which a semiconductor package may be loaded; a soak chamber configured to heat or cool the semiconductor package loaded on a test tray; a test chamber configured to make a contact between the semiconductor package transferred from the soak chamber and a test interface to perform a test on the semiconductor package; an exit chamber configured to store the semiconductor package on which the test is completed; an unloading unit configured to take out the test-completed semiconductor package; a coolant supplying apparatus provided in at least one of the soak chamber, the test chamber, and the exit chamber and configured to supply coolant; and a coolant supply control part configured to control a supply of the coolant supplied into the coolant supplying apparatus, wherein the coolant supplying apparatus may include: a housing having an outlet; a coolant spraying part arranged inside the housing and configured to discharge coolant around the outlet of the housing; and a dry air injection part configured to inject the dry air at the coolant spraying part in the housing so that the dry air may surround a path in which the coolant flows.

The effect of the present disclosure is not limited to the above description, and other effects not mentioned will be clearly understood by those skilled in the art from the subsequent description.

DETAILED DESCRIPTION OF THE INVENTION

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the subsequent description, if it is decided that the detailed description of known function or configuration related to the present disclosure makes the subject matter of the present disclosure unclear, the detailed description is omitted, and the same reference numerals will be used throughout the drawings to refer to the elements or parts with a same or similar function or operation.

Furthermore, in various embodiments, elements with the same configuration will be described in a representative embodiment by using the same reference numeral, and different configurations from the representative embodiment will be described in other embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words, such as "between" versus "directly between", "adjacent" versus "directly adjacent", etc., used to describe the relationship between elements should be interpreted in a like fashion. It will be further understood that the terms "comprises", "comprising", includes, and/or including, when used herein, specify the presence of stated features, integers, steps, operations, elements, and/or components, but do not preclude the presence or addition of one or more other features, integers, steps, operations, elements, components, and/or groups thereof.

In the flowing description, unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
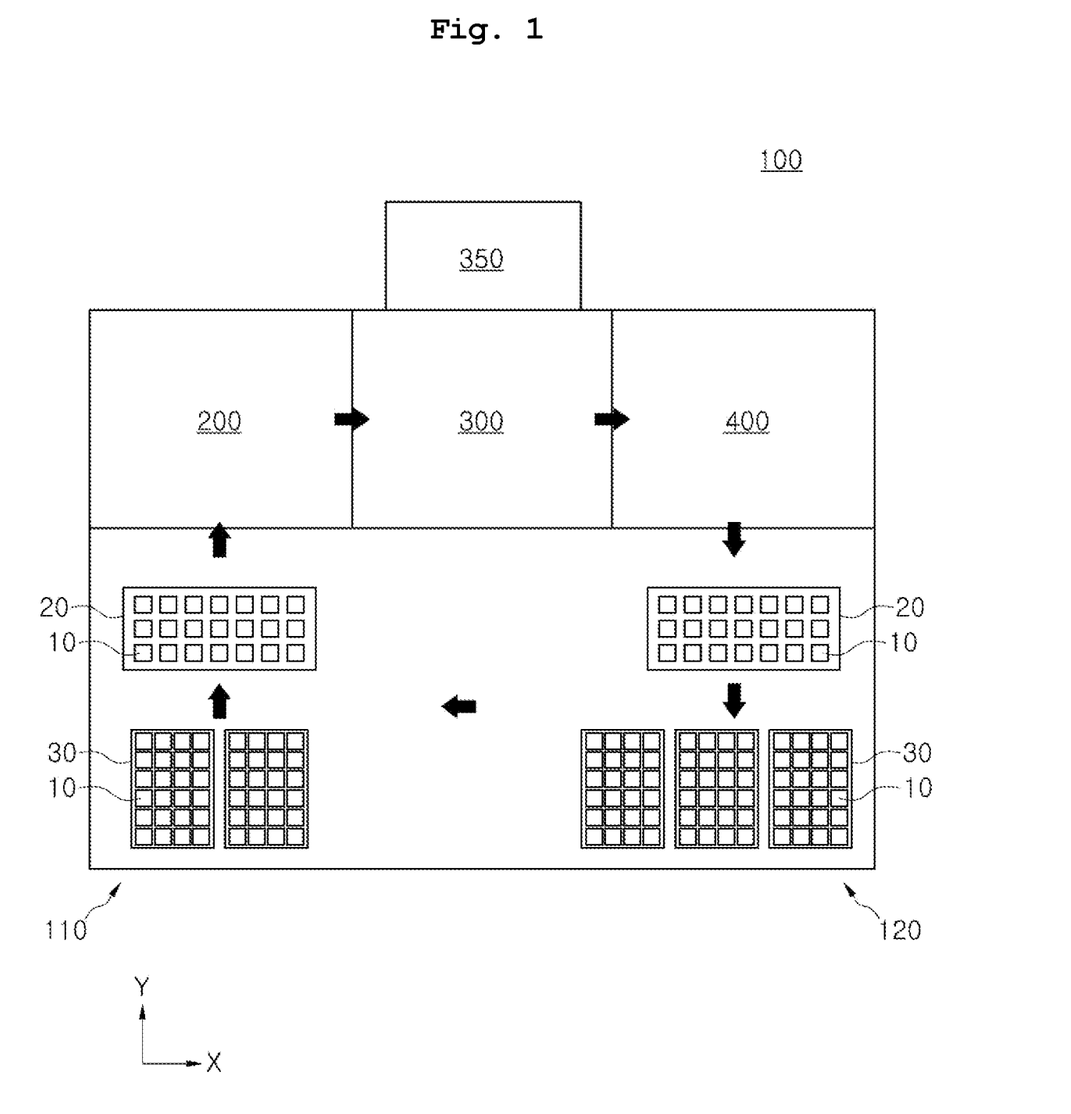
FIG. 1 is a view showing a schematic structure of a test handler to which the present disclosure is used.

FIG. 1 is a view showing a schematic structure of a test handler 100 to which the present disclosure is applicable. FIG. 1 is a schematic block diagram of the test handler 100, the view being taken from the top. In the specification, in order to test a function and/or performance of a semiconductor package 10 on which semiconductor processing and packaging are performed, the test handler 100 is an apparatus electrically connect the semiconductor package 10 to a test interface. Furthermore, in order to perform a test for the semiconductor package 10, the test handler 100 transfers the transferred semiconductor package 10 to a tray, provides environment (e.g., temperature) for the test, grades the tested semiconductor package 10, and takes out the semiconductor package 10. In the specification, the test handler 100 is described as a case in which the test handler 100 is connected to a test device through the test interface, but an embodiment of the specification is not limited thereto, and the test handler 100 may be integrally formed with the test device. In other words, the test handler 100 may be referred to as the test device. In an embodiment, the test interface may include various wirings to electrically connect a plurality of test channels of the test handler 100 to a corresponding output of a plurality of outputs (e.g., solder balls, leads, or pads) of the semiconductor package 10. The test handler 100 may output various control signals and data signals for operating the semiconductor package 10 via the plurality of test channels. The control signals and data signals may be transferred to the semiconductor package 10 via the test interface. The test handler may receive data signals outputted from the semiconductor package 10 via the test interface. Some of the plurality of channels may receive the data signals outputted from the semiconductor package 10.

Referring to FIG. 1, the test handler 100 may include a loading unit 110, a soak chamber 200, a test chamber 300, an exit chamber 400, and an unloading unit 120. First, a customer tray 30 (or C-Tray) storing the semiconductor package 10 to be tested is inserted into the test handler 100. The loading unit 110 loads the semiconductor package 10 stored on the customer tray 30 to a test tray 20 (or T-Tray). Herein, the test tray 20 and the customer tray 30 may be different from each other in at least one of size, the number of slots storing the semiconductor package 10, and distance between the slots. Although not shown in the drawings, the loading unit 110 may include a pickup device provided to adsorb the semiconductor package 10, and a driving part and a moving rail provided for movement of the pickup device. The test tray 20 on which the semiconductor package 10 is loaded may be transferred to the soak chamber 200 by a transfer device (not shown). The loading unit 110 and the unloading unit 120 may be collectively referred to as a loading part.

The soak chamber 200 may serve as a space for storing the test tray 20, and may be maintained in temperature environment (first temperature) for a test. In other words, the soak chamber 200 may store, at the first temperature, the test tray 20 transferred from the loading unit 110. The first temperature is the temperature preset as a test temperature for the semiconductor package 10 to be tested in the test chamber 300. In other words, the first temperature may the same as or similar to the test temperature. The test tray 20 stored in the soak chamber 200 may be transferred to the test chamber 300 by a transfer device (not shown).

The test chamber 300 is coupled to the test interface 350 and in which a test of the semiconductor package 10 is performed, and provides the environment for the test of the semiconductor package 10. The test interface 350 may be brought in contact with the semiconductor package 10 to apply an electrical signal, and may transmit the signal output by the semiconductor package 10 to the test device (not shown). The test chamber 300 may include a semiconductor device pressing device (i.e., a press not shown) to press the semiconductor package 10 such that the semiconductor package 10 is brought into contact with the test interface 350. The semiconductor package 10 of which the test is competed in the test chamber 300 may be transferred to the exit chamber 400. In an embodiment, the semiconductor device pressing device may be a hydraulic press or a pneumatic press. The present invention is not limited thereto. The semiconductor device pressing device may use various forces to secure proper contacts between the test interface 350 and the semiconductor package 10.

The exit chamber 400 is a space to store the test tray 20 storing the semiconductor package 10 on which the test is completed, and may be maintained at a second temperature (i.e.: room temperature). In other words, the exit chamber 400 may store, at the second temperature, the test tray 20 transferred from the test chamber 300. The test tray 20 stored in the exit chamber 400 may be transferred to the unloading unit 120 by a transfer device (not shown). The unloading unit 120 may grades and unload the semiconductor package 10 of the test tray 20 transferred from the exit chamber 400.

Hereinbelow, a coolant supplying apparatus 500 supplying coolant to adjust the temperature in each of the soak chamber 200, the test chamber 300, and the exit chamber 400 will be described.

Figure 2:
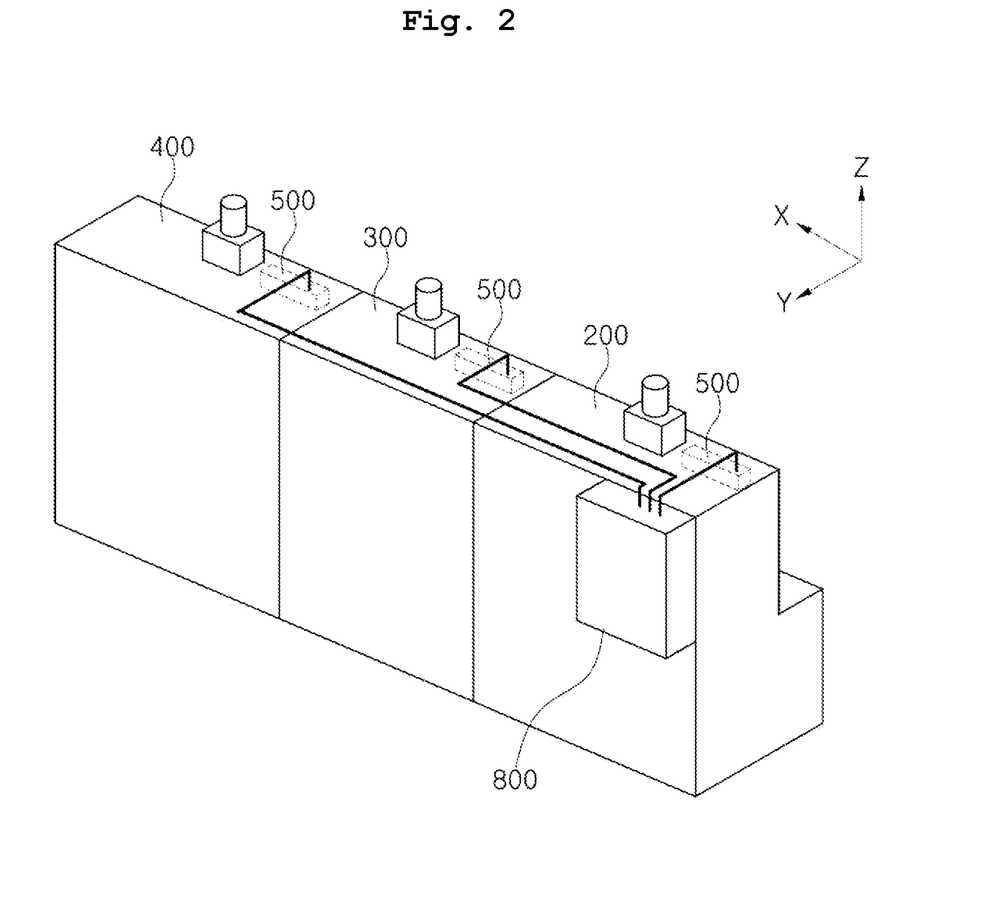
FIG. 2 is a view showing chambers of the test handler to which a coolant supplying apparatus according to the present disclosure is used.

FIG. 2 is a view showing chambers of the test handler 100 to which the coolant supplying apparatus 500 according to the present disclosure is used. Referring to FIG. 2, the soak chamber 200, the test chamber 300, and the exit chamber 400 are arranged in a horizontal direction (X direction), and the coolant supplying apparatus 500 is provided in each of the soak chamber 200, the test chamber 300, and the exit chamber 400 to adjust the temperature. In order to supply coolant to each coolant supplying apparatus 500, a coolant supply control part 800 may be located at one portion of the test handler 100, and the coolant supply control part 800 may control a coolant supply to the chambers 200, 300, and 400 while being supplied with coolant from an external tube.

Figure 3:
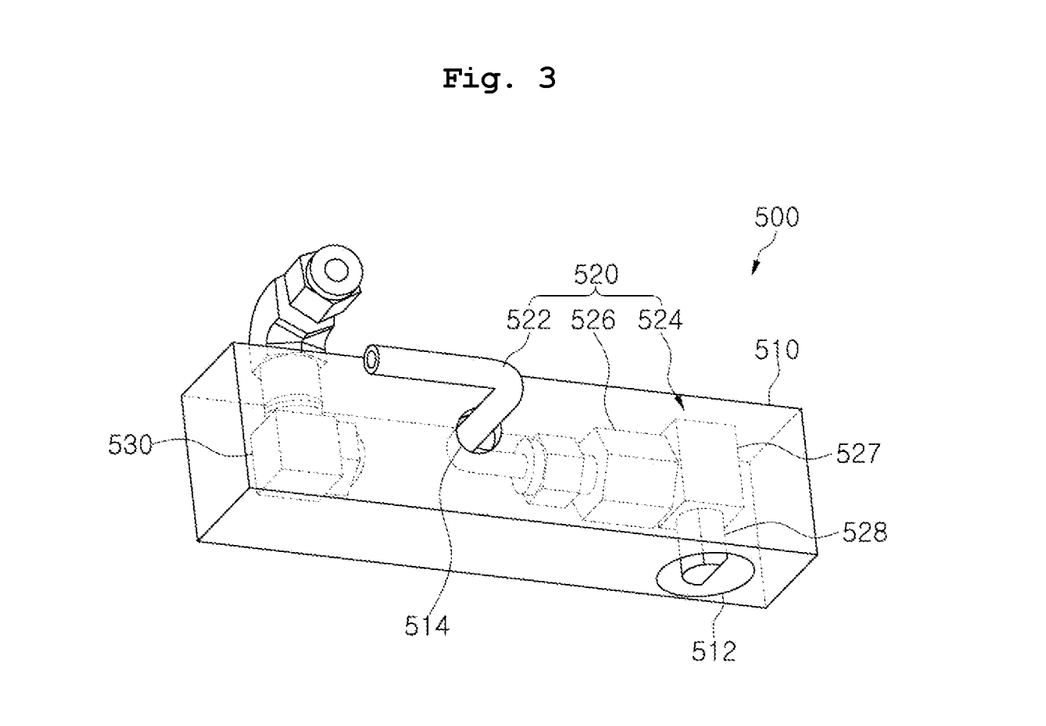
FIGS. 3 and 4 are views showing the coolant supplying apparatus according to an embodiment of the present disclosure.
Figure 4:
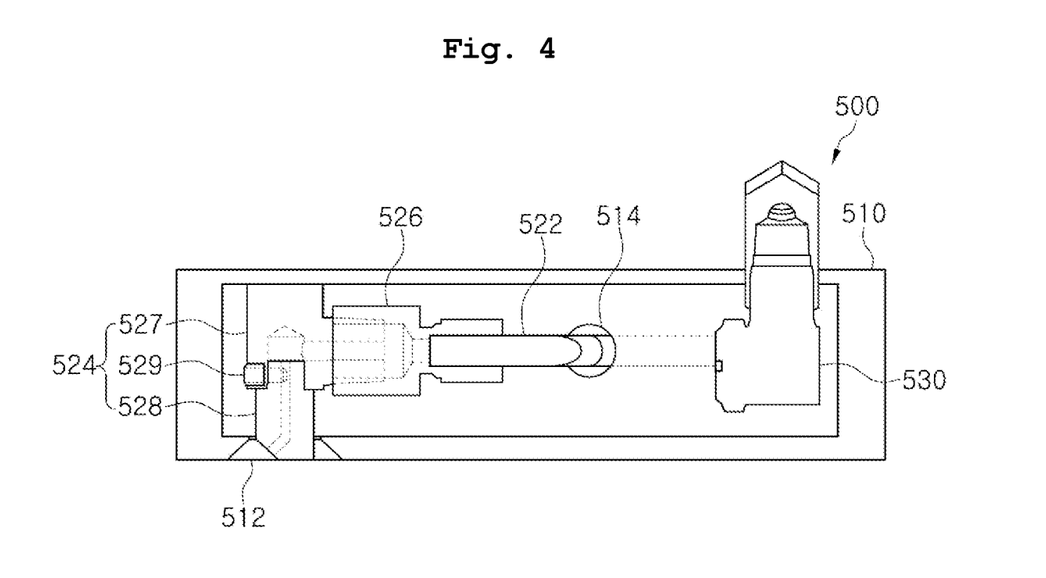

FIGS. 3 and 4 are views showing the coolant supplying apparatus 500 according to an embodiment of the present disclosure. According to the present disclosure, the coolant supplying apparatus 500 includes a housing 510 provided in a predetermined shape, a coolant spraying part 520 arranged inside the housing 510 and discharging coolant around an outlet 512 of the housing 510, and a dry air injection part 530 configured to inject dry air toward the coolant spraying part 520, inside the housing 510.

According to the present disclosure, the dry air discharged from the dry air injection part 530 flows around the coolant spraying part 520 and is discharged to the outside space of the housing through the outlet 512. The dry air is injected into the housing 510, and flows along the periphery of the coolant spraying part 520 located inside the housing 510, and is discharged around the outlet 512 with coolant. Therefore, the dry air blocks moisture around the coolant spraying part 520 and prevents condensation.

According to the embodiment of the present disclosure, as shown in FIG. 4, the outlet 512 of the housing 510 may have a tapered shape with a diameter that becomes longer in an outward direction. As the outlet 512 is formed in the tapered shape as shown in FIG. 4, the dry air is concentrated to a portion where coolant is discharged, so that condensation is prevented and both the coolant and the dry air may be discharged to the outside space. In an embodiment, the outlet 512 may include a funnel. The dry air may be discharged from a bottom of the funnel toward a top thereof, which is wider than the bottom, and the coolant may be discharged from an inner side surface of the funnel toward the top of the funnel.

According to the embodiment of the present disclosure, the coolant spraying part 520 includes a coolant supply tube 522 inserted into the housing 510 while passing through a through hole 514 formed at a side wall of the housing 510, a coolant discharge module 524 discharging coolant flowing in the coolant supply tube 522 to the outside space of the housing 510, and a connection member 526 connecting the coolant supply tube 522 to the coolant discharge module 524. The coolant supply tube 522 is connected to the tube outside the chambers 200, 300, and 400 and provides a path to supply coolant. The coolant supply tube 522 is connected to the coolant discharge module 524 through the connection member 526, and eventually, coolant is discharged to the outside space of the housing 510 by the coolant discharge module 524, so that the coolant may be supplied into the chambers 200, 300, and 400.

According to the embodiment of the present disclosure, the coolant discharge module 524 includes a nozzle fixation member 527 securely coupled to the housing 510 and coupled to the connection member 526 to provide a flow path of coolant, a nozzle member 528 coupled to the nozzle fixation member 527 and discharging the coolant flowing through the flow path to the outside space, and a flux regulating member 529 regulating the flux of the coolant discharged through the nozzle member 528.

The housing 510 may be formed in a large enough to insert both the coolant spraying part 520 and the dry air injection part 530, and may be realized with a box shape as shown in FIGS. 3 and 4. Although not shown in detail, the coolant spraying part 520 and the dry air injection part 530 may be arranged to be securely coupled to a structure such as a wall of the housing 510. The shape of the housing 510 is not limited to the rectangular box as shown in FIGS. 3 and 4, and may have a shape such as a cylinder shape.

Figure 5:
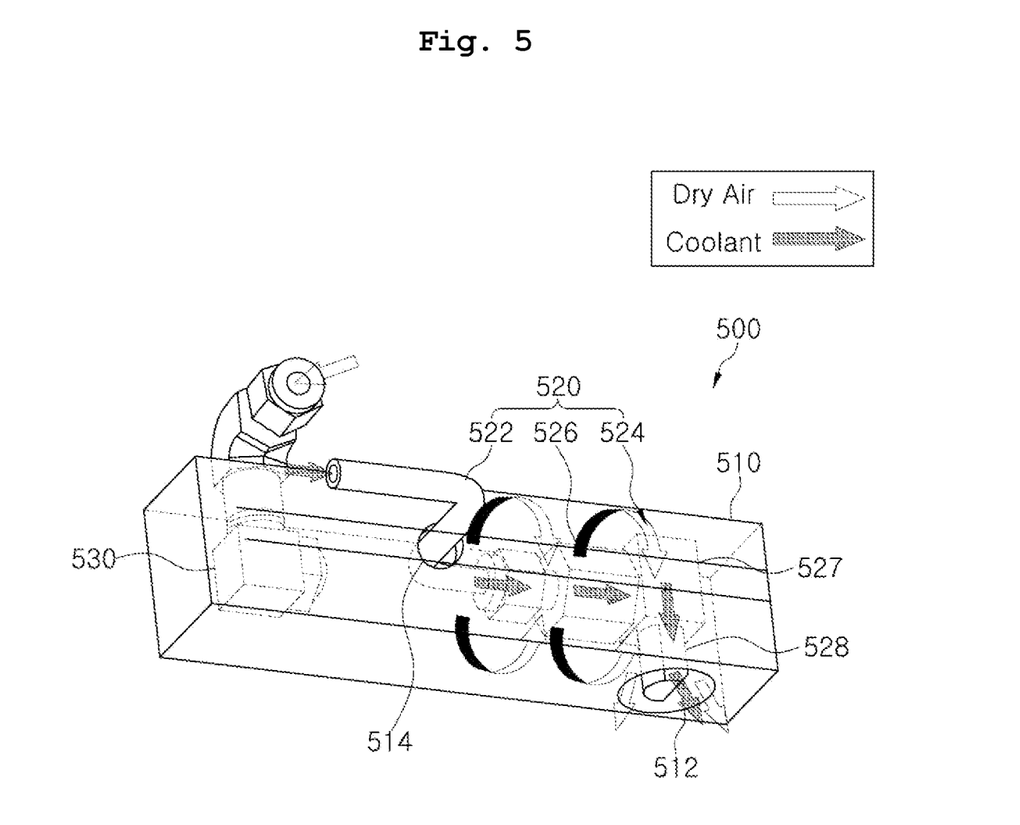
FIGS. 5 and 6 are views showing an example of flow paths of coolant and dry air in the coolant supplying apparatus according to the embodiment of the present disclosure.
Figure 6:
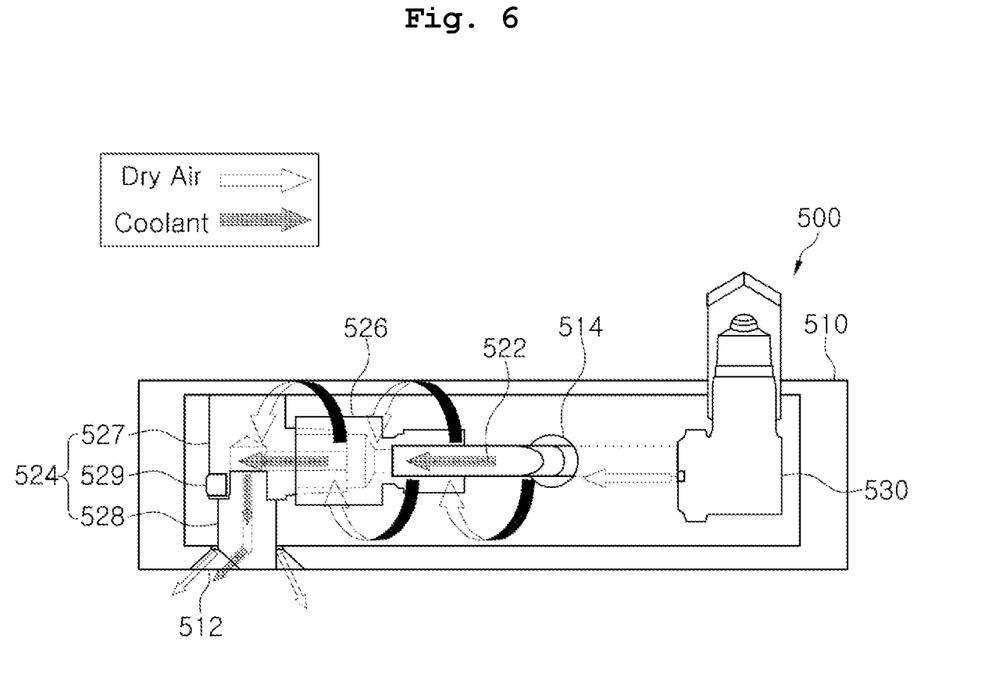

FIGS. 5 and 6 are views showing an example of flow paths of coolant and dry air in the coolant supplying apparatus 500 according to the embodiment of the present disclosure. Referring to FIGS. 5 and 6, the coolant introduced through the coolant supply tube 522 flows through the connection member 526 and the flow path of the nozzle fixation member 527 and eventually is discharged through the nozzle member 528.

Herein, an inflow path of coolant in the nozzle member 528 is arranged perpendicular to the flow path of the coolant in the coolant supply tube 522, and a direction in which the coolant is discharged to the outside space from the nozzle member 528 is bent by a predetermined angle (i.e., 45 degrees) with respect to the coolant inflow path. As shown in FIGS. 3 to 6, as the path of the coolant discharged from the nozzle member 528 is bent and the nozzle member 528 is rotatably provided, a direction in which the coolant is discharged may be controlled. In an embodiment, the coolant supply tube 522 through which the coolant flows may extend horizontally, and the nozzle member 528 through which the coolant is discharged may extend vertically. In an embodiment, the nozzle fixation member 527 may change a flow direction of the coolant from a horizontal direction to a vertical direction. In an embodiment, the changed flow direction by the nozzle fixation member 527 may be perpendicular to a flow direction of the coolant flowing through the coolant supply tube 522. In an embodiment, the changed flow direction by the nozzle fixation member 527 may correspond to a flow direction of the inflow path of the nozzle member 528. The nozzle member 528 may include a bent flow path and may be rotatable to adjust the flow direction of the inflow path to an inclined flow direction with respect to the inflow path.

Furthermore, the dry air is injected toward the coolant spraying part 520 inside the housing 510 by the dry air injection part 530, and the dry air flows around the coolant spraying part 520 and eventually is discharged through the outlet 512. As shown in FIGS. 5 and 6, the present disclosure is configured to confine the dry air inside the housing 510 and surround the coolant spraying part 520, so that condensation around the coolant spraying part 520 may be prevented.

Figure 7:
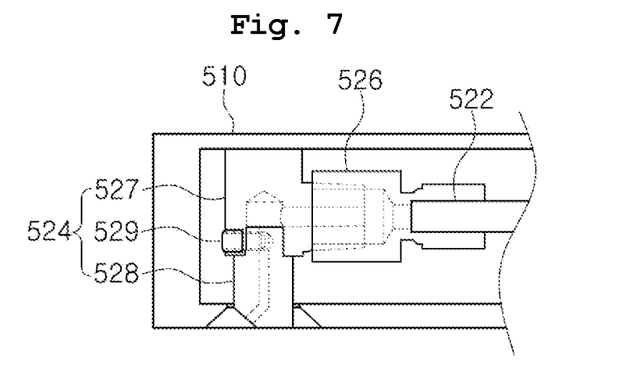
FIGS. 7 to 9 are views showing a case in which a coolant discharge direction is changed by a rotation of a nozzle member in the coolant supplying apparatus.
Figure 8:
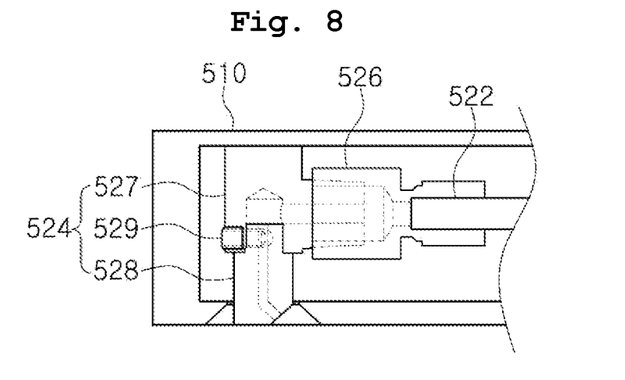
Figure 9:
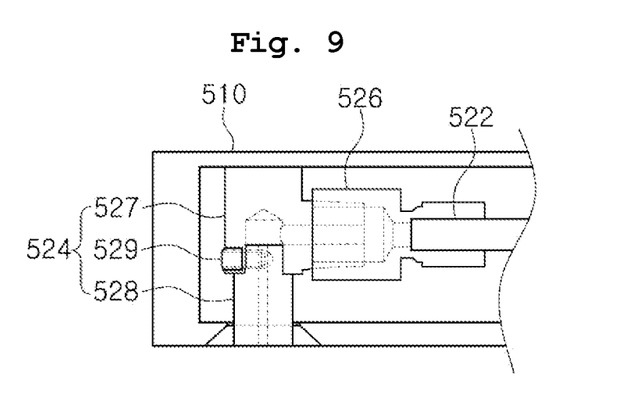

Furthermore, according to the embodiment of the present disclosure, the nozzle member 528 may be configured to be rotatable with respect to the nozzle fixation member 527. As the nozzle member 528 is rotated, it is possible to control a coolant spray path. For example, as shown in FIG. 7, an outlet of the nozzle member 528 may be controlled to face a first direction so as to spray coolant, and as shown in FIG. 8, the outlet of the nozzle member 528 may be controlled to face a direction opposite to the first direction by rotating the nozzle member 528 180 degrees. Furthermore, as shown in FIG. 9, the outlet of the nozzle member 528 may be controlled to face a direction perpendicular to the first direction by rotating the nozzle member 528 90 degrees.

Meanwhile, according to the embodiment of the present disclosure, the flux regulating member 529 may regulate the degree of opening the flow path formed in the nozzle member 528. Referring to FIGS. 7 to 9, the flux regulating member 529 may block a part of the flow path along which coolant flows inside the nozzle member 528, and the flux regulating member 529 may regulate the degree of opening of the flow path while moving forward and rearward. The flux regulating member 529 may be implemented in a shape such as a bolt that is capable of moving forward and rearward by the rotation.

Figure 10:
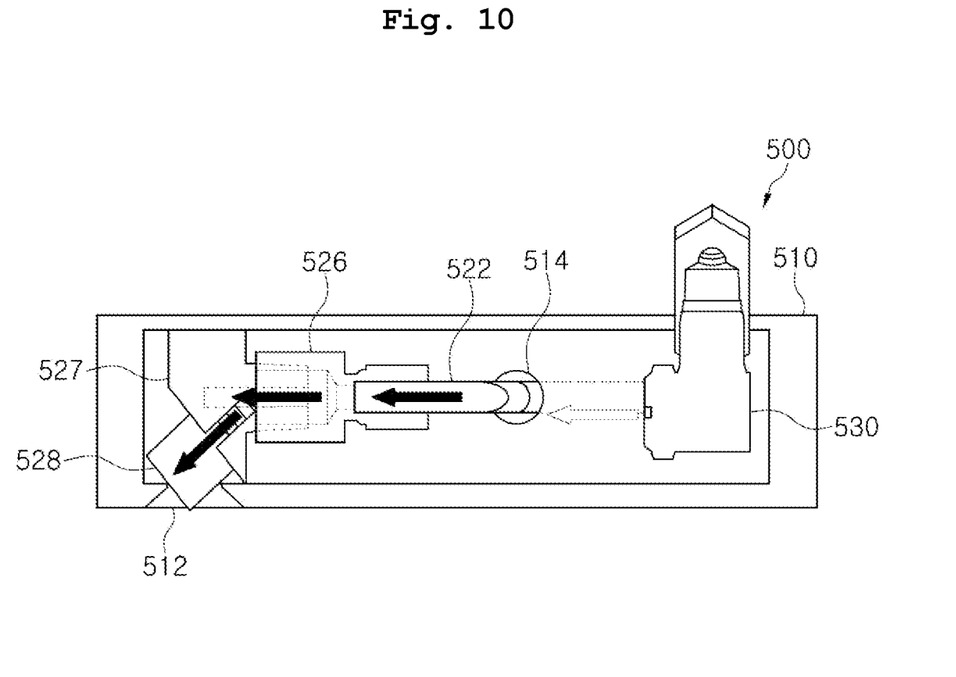
FIG. 10 is a view showing the coolant supplying apparatus according to an embodiment of the present disclosure.

According to an embodiment of the present disclosure, as shown in FIG. 10, a path of coolant flowing into and discharged from the nozzle member 528 may be configured to be bent by a predetermined angle with respect to the coolant flow path of the coolant supply tube 522. When the coolant flow path is provided as shown in FIG. 10, a bent section of the flow path is relatively small, so that a section where the coolant stagnates is reduced and the supply efficiency of the coolant can be increased.

Meanwhile, the nozzle member 528 may be provided to protrude to the outside space of the housing 510. In other words, the nozzle member 528 according to the present disclosure may have a shape protruding to the outside while passing through the outlet 512.

Figure 11:
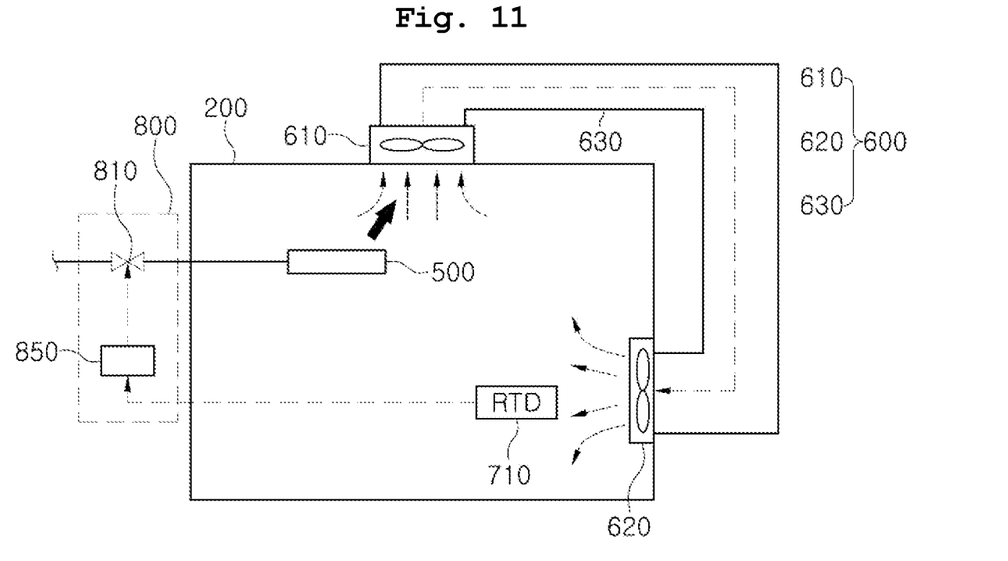
FIGS. 11 and 12 are views schematically showing a flow of an air current in the chamber to which a temperature controlling apparatus according to an embodiment of the present disclosure is applied.

FIG. 11 is a view schematically showing a flow of an air current in the chamber to which a temperature controlling apparatus according to an embodiment of the present disclosure is applied. FIG. 11 shows a case in which the coolant supplying apparatus 500 is applied to adjust the temperature of the soak chamber 200. A structure similar to FIG. 11 may be applied to not only the soak chamber 200 but also both the test chamber 300 and the exit chamber 400.

Referring to FIG. 11, the temperature controlling apparatus includes: an air current generating part 600 generating a circulating air current in the processing space of the soak chamber 200, a temperature measurement part 710 provided inside the soak chamber 200 and measuring the temperature in the soak chamber 200, the coolant supply control part 800 controlling a supply of coolant on the basis of the temperature measured by the temperature measurement part 710, and the coolant supplying apparatus 500 supplying coolant into the soak chamber 200. As described with reference FIGS. 3 and 4, the coolant supplying apparatus 500 includes the housing 510 provided in the predetermined shape, the coolant spraying part 520 arranged inside the housing 510 and spraying coolant around the outlet 512 of the housing 510, and the dry air injection part 530 injecting dry air into the housing 510 toward the coolant spraying part 520. As described above, the coolant supplying apparatus 500 may be configured such that the dry air flows around the coolant spraying part 520 and is discharged into the processing space of the soak chamber 200 through the outlet 512.

According to the embodiment of the present disclosure, the air current generating part 600 includes an air inlet 610 located at a first portion of the soak chamber 200 and suctioning air from the processing space of the soak chamber 200, an air outlet 620 located at a second portion of the soak chamber 200 and discharging air into the processing space of the soak chamber 200, and a circulation tube 630 communicating the air inlet 610 to the air outlet 620. Referring to FIG. 11, the air suctioned through the air inlet 610 may flow into the air outlet 620 through the circulation tube 630, and the air supplied into the soak chamber 200 through the air outlet 620 may be circulated while being suctioned through the air inlet 610 again. Although not shown in the drawing, a structure to supply air into the soak chamber 200 and a structure to discharge air in the soak chamber 200 to the outside space may be provided.

Meanwhile, according to the embodiment of the present disclosure, the coolant supplying apparatus 500 may be provided at a location adjacent to the air inlet 610, inside the soak chamber 200. Furthermore, the nozzle member 528 of the coolant supplying apparatus 500 may be configured to spray coolant toward the air inlet 610. As shown in FIG. 11, the coolant supplying apparatus 500 may be provided adjacent to the air inlet 610 inside the soak chamber 200, and a coolant discharge direction of the nozzle member 528 may be set to face the air inlet 610. As described above, since the nozzle member 528 is configured to be rotatable, the coolant discharge direction may be set to face the air inlet 610 by rotating the nozzle member 528. Furthermore, even when the coolant discharge direction of the nozzle member 528 is fixed, the coolant discharge direction may be adjusted to face the air inlet 610 by adjusting the installation direction of the coolant supplying apparatus 500.

Referring to FIG. 11, the coolant discharged toward the air inlet 610 flows into the air outlet 620 through the circulation tube 630, and is supplied into the soak chamber 200 through the air outlet 620. As shown in FIG. 11, as the coolant is supplied into the soak chamber 200 through the circulation tube 630, the coolant is uniformly spread throughout the processing space of the soak chamber 200.

Meanwhile, the temperature measurement part 710 is arranged at a location in the soak chamber 200, the location being located around the air outlet 620. The temperature measurement part 710 measures the temperature around the air outlet 620, thereby measuring the temperature of air circulated in the soak chamber 200. The temperature around the coolant supplying apparatus 500 is mainly affected by coolant, so there is a problem in that the actual temperature of the soak chamber 200 is not reflected. However, as shown in FIG. 11, the temperature measurement part 710 is arranged around the air outlet 620 to measure the temperature of the circulated air, so that the temperature of the soak chamber 200 may be more precisely reflected. A resistance thermometer detector (RTD) measuring the temperature by detecting changes in electrical resistance according to temperature may be used as the temperature measurement part 710.

According to the embodiment of the present disclosure, the coolant supply control part 800 may include an opening valve 810 opening or closing the flow path of the coolant supply tube 522, and a controller 850 controlling opening or closing of the opening valve on the basis of the temperature measured by the temperature measurement part 710. A temperature value of the soak chamber 200 measured by the temperature measurement part 710 is provided to the controller 850 of the coolant supply control part 800 controlling a supply of coolant to the coolant supplying apparatus 500. The controller 850 compares a current temperature with a target temperature of the soak chamber 200, and controls a supply of coolant so that the current temperature matches the target temperature. For example, when the target temperature is −50° C. and the current temperature is −40° C., the controller 850 opens the opening valve 810 to supply coolant, and after a period of time, when the current temperature is lower than −50° C., the controller 850 may close the opening valve 810 to stop the supply of coolant. Furthermore, a flow control valve that is controllable by an electrical signal may be used instead of the opening valve 810, and the degree of opening of the flow control valve is adjusted in response to the temperature of the chamber so that the amount of supply of coolant may be adjusted.

FIG. 11 schematically shows the configuration for adjusting the temperature of the soak chamber 200, but the scope of the present disclosure is not limited thereto and may be used to other temperature adjustment system. For example, according to the present disclosure, the temperature controlling apparatus may be used to adjust the temperature of the test chamber 300 or the exit chamber 400 of the test handler 100.

Figure 12:
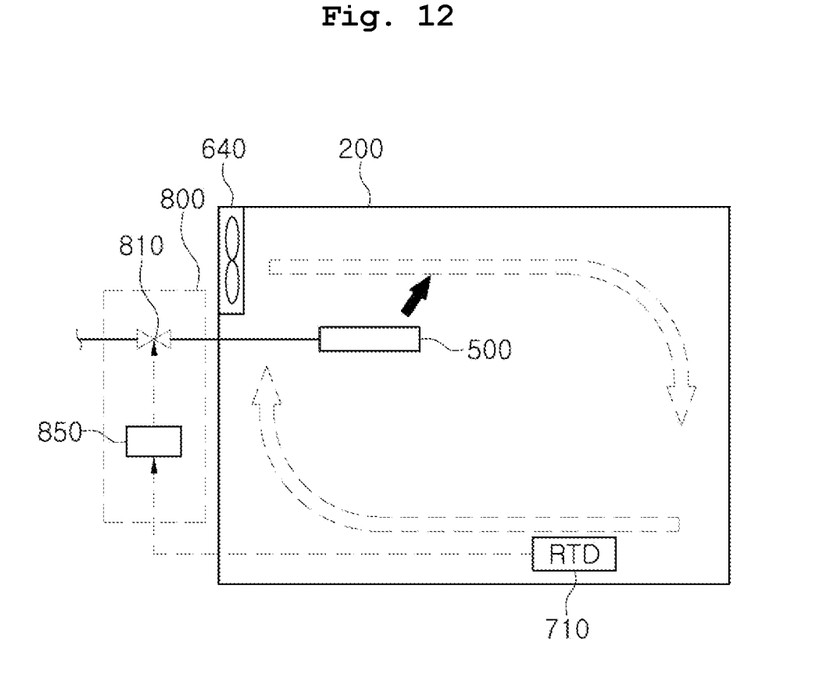

Meanwhile, according to an embodiment of the present disclosure, the air current generating part 600 includes a fan blower 640 located at one portion of the chamber (e.g., the soak chamber 200) to guide a flow of air into the processing space of the chamber. The coolant supplying apparatus 500 is installed, at a location adjacent to the fan blower 640, inside the chamber, and is configured to spray coolant toward the fan blower 640. Referring to FIG. 12, the fan blower 640 is provided at the one portion of the soak chamber 200, and the coolant supplying apparatus 500 may be installed around the fan blower 640. As show in FIG. 12, the coolant flows along an air current generated by the fan blower 640 and the fan blower 640 may allow the coolant to be spread throughout the processing space of the soak chamber 200. Therefore, the overall temperature of the processing space of the soak chamber 200 may be adjusted by the coolant.

Figure 13:
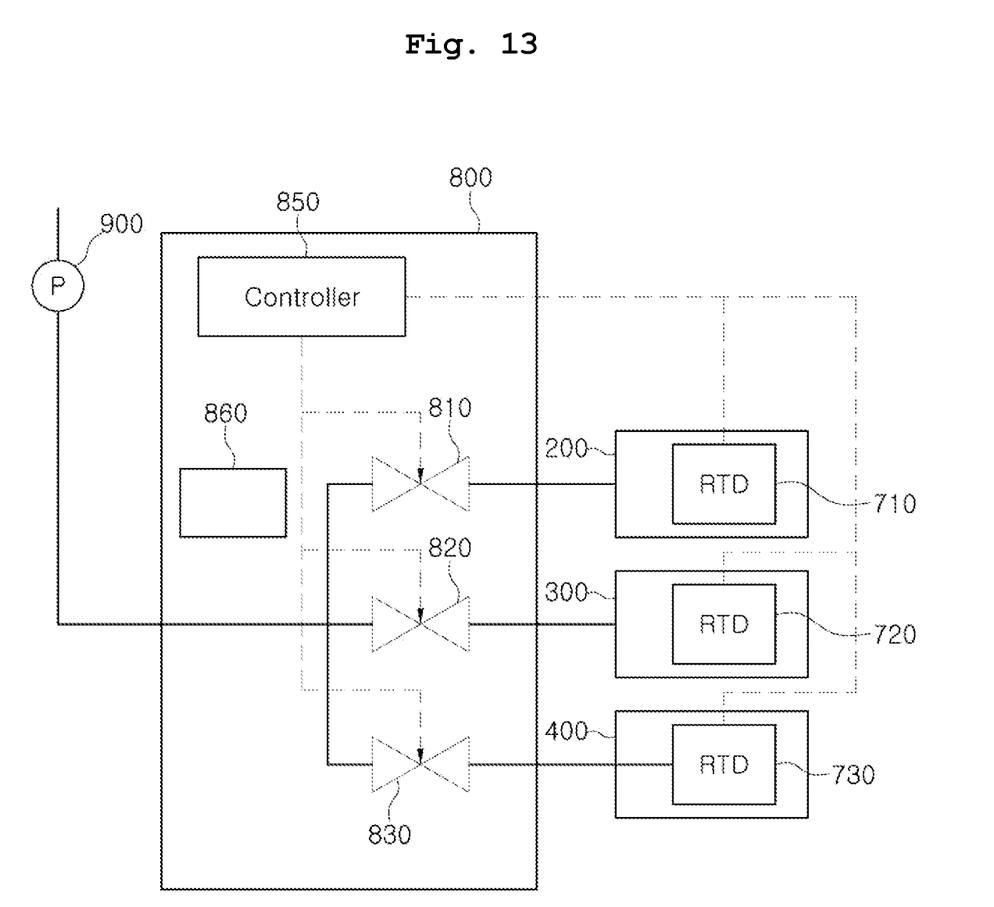
FIG. 13 is a view showing a schematic structure of the temperature controlling apparatus according to the embodiment of the present disclosure.

FIG. 13 is a view showing a schematic structure of the temperature controlling apparatus according to the embodiment of the present disclosure. Referring to FIG. 13, each of the soak chamber 200, the test chamber 300, and the exit chamber 400 includes the temperature measurement part 710, 720, 730, and each temperature measurement part 710, 720, 730 measures the temperature of the chambers 200, 300, and 400. The temperature information measured by each temperature measurement part 710, 720, 730 is transmitted to the controller 850. The controller 850 may compare the current temperature in the chambers 200, 300, and 400 with the target temperature, and may control the degree of opening of each opening valve 810, 820, 830, so that the current temperature of the chamber may be maintained at the target temperature.

Referring to FIG. 2 described above, according to the embodiment of the present disclosure, the test handler 100 providing the environment for test of the semiconductor package 10 includes: the loading unit 110 on which the semiconductor package 10 is loaded; the soak chamber 200 preheating or precooling the semiconductor package loaded on the test tray 20; the test chamber 300 performing a test by pressing the semiconductor package 10 transferred from the soak chamber 200 by the test interface 350; the exit chamber 400 storing the semiconductor package 10 on which the test is completed; the unloading unit 120 taking out the test-completed semiconductor package 10 to the outside space; the coolant supplying apparatus 500 provided in at least one of the soak chamber 200, the test chamber 300, and the exit chamber 400 to supply coolant thereto; and the coolant supply control part 800 controlling a supply of coolant into the coolant supplying apparatus 500. The coolant supplying apparatus 500 includes the housing 510 provided in the predetermined shape, the coolant spraying part 520 arranged inside the housing 510 and spraying coolant around the outlet 512 of the housing 510, and the dry air injection part 530 configured to inject dry air such that the dry air surrounds the path of coolant flowing toward the coolant spraying part 520 inside the housing 510.

Each of the soak chamber 200, the test chamber 300, and the exit chamber 400 includes the temperature measurement part 710, 720, 730 measuring the temperature, and the coolant supply control part 800 may control the supply of coolant on the basis of the temperature measured by the temperature measurement part 710, 720, 730.

The controller 850 and the opening valve 810, 820, 830 may be provided in a control box located outside the chambers 200, 300, and 400, as shown in FIG. 2. Meanwhile, dew condensation may be generated around the coolant supply tube 522 and the opening valve 810, 820, 830 inside the control box. Therefore, a heater 860 may be provided to prevent the dew condensation from being generated in the control box, and thermal energy generated by the heater 860 may prevent the dew condensation from being generated. Furthermore, according to an embodiment of the present disclosure, the dry air supply device is provided inside the control box, so that dry air is supplied toward the coolant supply tube 522 and the opening valve 810, 820, 830 to prevent the dew condensation from being generated.

Although the embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A coolant supplying apparatus comprising:
a housing having an outlet;

a coolant spraying part arranged inside the housing and configured to discharge coolant around the outlet of the housing; and
a dry air injection part configured to inject dry air into the housing,
wherein the dry air injection part is configured to cause the dry air to flow around the coolant spraying part inside the housing and discharge the dry air to an outside of the housing through the outlet of the housing through which the coolant is discharged,
wherein the coolant spraying part comprises a rotatable nozzle member configured to discharge the coolant to the outlet of the housing,
wherein a direction in which the coolant is discharged to the outside of the housing from the nozzle member is bent by a predetermined angle with respect to a coolant inflow path to the nozzle member, and
wherein the direction in which the coolant is discharged to the outside of the housing is adjusted by rotating the nozzle member.

2. The coolant supplying apparatus of claim 1,
wherein the dry air injection part is configured to flow the dry air around the coolant spraying part and discharge the dry air to an outside space through the outlet of the housing.

3. The coolant supplying apparatus of claim 1,
wherein the outlet of the housing includes a funnel.

4. The coolant supplying apparatus of claim 1,
wherein the coolant spraying part comprises:
 a coolant supply tube inserted into the housing while passing through a through hole formed at a side wall of the housing;
 a coolant discharge module configured to discharge the coolant flowing in the coolant supply tube to an outside space of the housing; and
 a connection member connecting the coolant supply tube to the coolant discharge module.

5. The coolant supplying apparatus of claim 4,
wherein the coolant discharge module comprises:
 a nozzle fixation member securely coupled to the housing, and configured to provide a flow path of the coolant while being coupled to the connection member; and
 a flux regulating member configured to regulate a flux of the coolant discharged through the nozzle member, and
 wherein the nozzle member is coupled to the nozzle fixation member.

6. The coolant supplying apparatus of claim 5,
wherein the nozzle member is configured to be rotatable with respect to the nozzle fixation member.

7. The coolant supplying apparatus of claim 5,
wherein the flux regulating member is configured to control a degree of opening of the flow path provided inside the nozzle member.

8. The coolant supplying apparatus of claim 5,
wherein the coolant supply tube extends horizontally to provide a coolant flow path, and
wherein the nozzle fixation member is configured to change a flow direction of the coolant received from the coolant supply tube to a coolant inflow path of the nozzle member, the coolant inflow path being directed perpendicular to the coolant flow path.

9. A temperature controlling apparatus comprising:
an air current generating part configured to generate an air current in a processing space in a chamber;
a temperature measurement part provided inside the chamber and configured to measure temperature in the chamber;
a coolant supply control part configured to control a supply of coolant on the basis of the temperature measured by the temperature measurement part; and
a coolant supplying apparatus configured to supply coolant into the chamber,
wherein the coolant supplying apparatus comprises:
a housing having an outlet;
a coolant spraying part arranged inside the housing and configured to spray coolant around the outlet of the housing; and
a dry air injection part configured to inject dry air into the housing,
wherein the dry air injection part is configured to cause the dry air to flow around the coolant spraying part inside the housing and discharge the dry air to an outside of the housing through the outlet of the housing through which the coolant is discharged,
wherein the coolant spraying part comprises a rotatable nozzle member configured to discharge the coolant to the outlet of the housing,
wherein a direction in which the coolant is discharged to the outside of the housing from the nozzle member is bent by a predetermined angle with respect to a coolant inflow path to the nozzle member, and
wherein the direction in which the coolant is discharged to the outside of the housing is adjusted by rotating the nozzle member.

10. The temperature controlling apparatus of claim 9,
wherein the dry air injection part is configured to flow the dry air around the coolant spraying part and discharge the dry air into the processing space through the outlet.

11. The temperature controlling apparatus of claim 9,
wherein the air current generating part comprises:
 an air inlet located at a first portion of the chamber and configured to suction air from the processing space;
 an air outlet located at a second portion of the chamber and configured to discharge air into the processing space; and
 a circulation tube connecting the air inlet to the air outlet.

12. The temperature controlling apparatus of claim 11,
wherein the coolant spraying part comprises:
 a coolant supply tube inserted into the housing while passing through a through hole formed at a side wall of the housing;
 a coolant discharge module configured to discharge coolant flowing in the coolant supply tube to an outside space of the housing; and
 a connection member connecting the coolant supply tube to the coolant discharge module.

13. The temperature controlling apparatus of claim 12,
wherein the coolant discharge module comprises:
 a nozzle fixation member securely coupled to the housing, and configured to provide a flow path of the coolant while being coupled to the connection member; and
 a flux regulating member configured to regulate a flux of the coolant discharged through the nozzle member, and
 wherein the nozzle member is coupled to the nozzle fixation member.

14. The temperature controlling apparatus of claim 13,
wherein the coolant supplying apparatus is provided at a location adjacent to the air inlet in the chamber, and wherein the nozzle member is arranged to spray the coolant toward the air inlet.

15. The temperature controlling apparatus of claim 12, wherein the coolant supply control part comprises:
   an opening valve configured to open or close a flow path; of the coolant supply tube; and
   a controller configured to control opening and closing of the opening valve on the basis of the temperature measured by the temperature measurement part.

16. The temperature controlling apparatus of claim 11, wherein the temperature measurement part is arranged at a location adjacent to the air outlet in the chamber.

17. The temperature controlling apparatus of claim 9, wherein the air current generating part comprises a fan blower located at one portion of the chamber and configured to guide an air flow into the processing space of the chamber, and
wherein the coolant supplying apparatus is provided at a location adjacent to the fan blower in the chamber, and is configured to spray the coolant toward the fan blower.

18. A test handler comprising:
   a loading unit on which a semiconductor package is loaded;
   a soak chamber configured to heat or cool the semiconductor package loaded on a test tray;
   a test chamber configured to make a contact between the semiconductor package transferred from the soak chamber and a test interface to perform a test on the semiconductor package;
   an exit chamber configured to store the semiconductor package on which the test is completed;
   an unloading unit configured to take out the test-completed semiconductor package;
   a coolant supplying apparatus provided in at least one of the soak chamber, the test chamber, and the exit chamber and configured to supply coolant; and
   a coolant supply control part configured to control a supply of the coolant supplied into the coolant supplying apparatus,
wherein the coolant supplying apparatus comprises:
   a housing having an outlet;
   a coolant spraying part arranged inside the housing and configured to discharge coolant around the outlet of the housing; and
   a dry air injection part configured to inject dry air at the coolant spraying part in the housing, so that the dry air surrounds a path in which the coolant flows,
wherein the dry air injection part is configured to cause the dry air to flow around the coolant spraying part inside the housing and discharge the dry air to an outside of the housing through the outlet of the housing through which the coolant is discharged,
wherein the coolant spraying part comprises a rotatable nozzle member configured to discharge the coolant to the outlet of the housing,
wherein a direction in which the coolant is discharged to the outside of the housing from the nozzle member is bent by a predetermined angle with respect to a coolant inflow path to the nozzle member, and
wherein the direction in which the coolant is discharged to the outside of the housing is adjusted by rotating the nozzle member.

19. The test handler of claim 18, wherein each of the soak chamber, the test chamber, and the exit chamber comprises a temperature measurement part, and
wherein the coolant supply control part is configured to control coolant supply on the basis of temperature measured by the temperature measurement part.

* * * * *